(12) United States Patent
Ano et al.

(10) Patent No.: US 12,719,450 B2
(45) Date of Patent: Aug. 25, 2026

(54) ACOUSTIC WAVE DEVICES AND MODULES WITH ACOUSTIC WAVE DEVICES

(71) Applicant: Sanan Japan Technology Corporation, Tokyo (JP)

(72) Inventors: Takashi Ano, Tokyo (JP); Hiroshi Nakamura, Tokyo (JP); Yuki Koto, Tokyo (JP)

(73) Assignee: Sanan Japan Technology Corporation, Tokyo (JP)

( * ) Notice: Subject to any disclaimer, the term of this patent is extended or adjusted under 35 U.S.C. 154(b) by 84 days.

(21) Appl. No.: 18/646,353

(22) Filed: Apr. 25, 2024

(65) Prior Publication Data

US 2024/0364310 A1 Oct. 31, 2024

(30) Foreign Application Priority Data

Apr. 27, 2023 (JP) ................................ 2023-073889

(51) Int. Cl.
*H03H 9/64* (2006.01)
*H03H 9/25* (2006.01)

(52) U.S. Cl.
CPC ............ *H03H 9/6483* (2013.01); *H03H 9/25* (2013.01)

(58) Field of Classification Search
CPC ...... H03H 9/725; H03H 9/40; H03H 9/14597; H03H 9/1452; H03H 9/25; H03H 9/6483
See application file for complete search history.

(56) References Cited

U.S. PATENT DOCUMENTS

| | | | | |
|---|---|---|---|---|
| 9,118,303 | B2 * | 8/2015 | Inoue | H03H 9/6483 |
| 9,742,377 | B2 * | 8/2017 | Iwaki | H03H 9/02228 |
| 2007/0090895 | A1 * | 4/2007 | Nishizawa | H03H 9/02874 333/195 |
| 2017/0331456 | A1 * | 11/2017 | Ono | H03H 9/725 |
| 2018/0131348 | A1 * | 5/2018 | Takahashi | H03H 9/1457 |

* cited by examiner

*Primary Examiner* — Quan Tra
(74) *Attorney, Agent, or Firm* — Dorsey & Whitney LLP

(57) ABSTRACT

An acoustic wave device includes a first filter, a second filter, a ground terminal, a common terminal connected to an output side of the first filter and an input side of the second filter, a first filter terminal connected to an input side of the first filter, a second filter terminal connected to an output side of the second filter, a ground electrode connected to a metal body for ground that includes the ground terminal or a wiring connected to the ground terminal, an input side ultrasonic delay electrode connected to an input side metal body arranged in parallel with the ground electrode on one side of the ground electrode, an output side ultrasonic delay electrode connected to an output side metal body arranged in parallel with the ground electrode on another side of the ground electrode.

14 Claims, 10 Drawing Sheets

FIG. 3

ACOUSTIC WAVE DEVICES AND MODULES WITH ACOUSTIC WAVE DEVICES

CROSS-REFERENCE TO RELATED APPLICATION(S)

This application claims priority to Japanese Application No. 2023-073889, filed Apr. 27, 2023, which are incorporated herein by reference, in their entirety, for any purpose.

BACKGROUND OF THE INVENTION

Field of the Invention

The present disclosure relates to an acoustic wave device and a module including the acoustic wave device.

Background Art

Patent Document 1 (JP2014-120841) discloses an acoustic wave device. The acoustic wave device described in Patent Document 1 includes a plurality of filters. The acoustic wave device includes an additional circuit. The isolation characteristics of the acoustic wave device can be improved by the additional circuit.

However, the acoustic wave device described in Patent Literature 1 requires an additional circuit in addition to the filter. Therefore, the configuration of the acoustic wave device may be complicated.

SUMMARY OF THE INVENTION

Some examples described herein may address the above-described problems. Some examples described herein may have an object to provide an acoustic wave device capable of improving isolation characteristics with a simpler configuration, and a module including the acoustic wave device.

In some examples, an acoustic wave device includes a first filter, a second filter, a ground terminal, a common terminal connected to an output side of the first filter and an input side of the second filter, a first filter terminal connected to an input side of the first filter, a second filter terminal connected to an output side of the second filter, a ground electrode connected to a metal body for ground that includes the ground terminal or a wiring connected to the ground terminal, an input side ultrasonic delay electrode connected to an input side metal body arranged in parallel with the ground electrode on one side of the ground electrode and includes the first filter terminal or a wiring connected to the first filter terminal, an output side ultrasonic delay electrode connected to an output side metal body arranged in parallel with the ground electrode on another side of the ground electrode and includes the common terminal or a wiring connected to the common terminal.

BRIEF DESCRIPTION OF THE DRAWING

FIG. 3 is an enlarged view of A part of FIG. 2.

DETAILED DESCRIPTION

Figure 1:
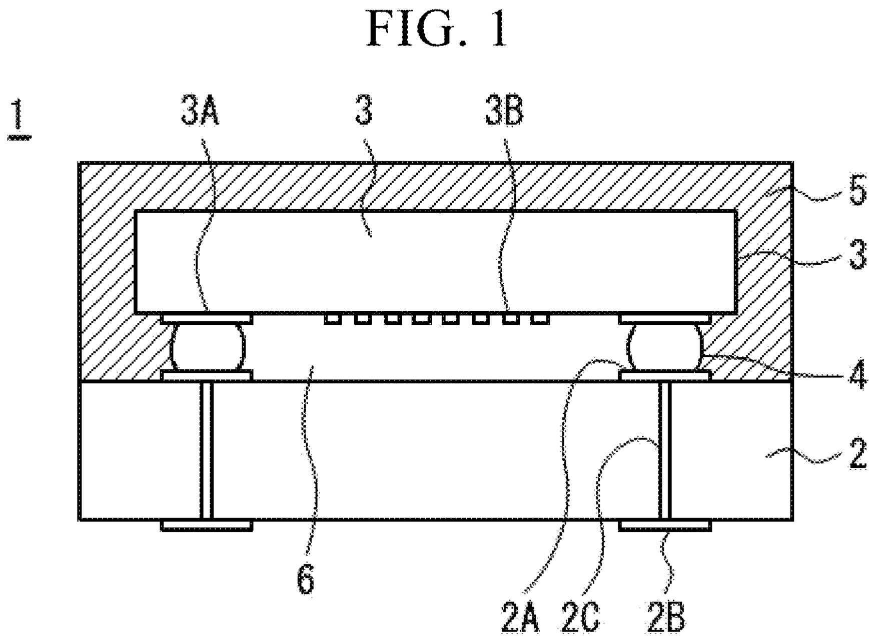
FIG. 1 is a cross-sectional view of an acoustic wave device according to a first embodiment.

The embodiments will be described with reference to the accompanying drawings. In the drawings, the same or corresponding parts are denoted by the same reference numerals. Duplicate descriptions of such portions may be simplified or omitted.

First Embodiment

FIG. 1 is a cross-sectional view of an acoustic wave device according to a first embodiment.

As shown in FIG. 1, the acoustic wave device 1 includes a wiring substrate 2, a chip substrate 3, a plurality of bumps 4, and a sealing portion 5.

The wiring substrate 2 is a multilayer substrate made of resin. For example, the wiring substrate 2 is a low-temperature co-fired ceramic (Low Temperature Co-Fired Ceramics: LTCC) multilayer substrate includes a plurality of dielectric layers. The wiring substrate 2 includes a passive element (not shown) such as a capacitor or an inductor.

In FIG. 1, an upper surface of the wiring substrate 2 is a component mounting surface. Plurality of conductive pads 2A are formed on the upper surface of the wiring substrate 2. The plurality of conductive pads 2A may be formed of copper for example. The lower surface of the wiring substrate 2 is an attachment surface to a mother substrate or the like. The plurality of conductive pads 2B are formed on the lower surface of the wiring substrate 2. The plurality of conductive pads 2B may be formed of copper for example. The plurality of inner conductors 2C are embedded in the wiring substrate 2. The plurality of inner conductors 2C are formed of copper for example. Each of the inner conductors 2C electrically connects the conductive pad 2A and the conductive pad 2B corresponding to each other.

The chip substrate 3 faces the wiring substrate 2. The chip substrate 3 is formed of a piezoelectric single crystal such as lithium tantalate, lithium niobate, or quartz crystal. The chip substrate 3 is formed of piezoelectric ceramics for example. The chip substrate 3 is formed by bonding the piezoelectric substrate and a support substrate for example. The support substrate is formed of sapphire, silicon, alumina, spinel, quartz or glass.

The first filter and the second filter are formed on a main surface (lower surface in FIG. 1) of the chip substrate 3 for example. The first filter is a surface acoustic wave filter for example. The first filter is a transmitting filter for example. The second filter is a surface acoustic wave filter for example. The second filter is a reception filter for example.

The transmitting filter is formed such that an electrical signal of a desired frequency band can pass through. For example, the transmitting filter includes a ladder-type filter including a plurality of series resonators and a plurality of parallel resonators.

The reception filter is formed such that an electrical signal of a desired frequency band can pass through. For example, the reception filter includes a ladder-type filter including a plurality of series resonators and a plurality of parallel resonators.

For example, the chip substrate 3 includes a wiring patterns 3A and a plurality of electrodes 3B. For example, the plurality of electrodes 3B are Interdigital Transducer (IDT) electrodes including comb-shaped electrode fingers.

Each of the plurality of bumps 4 is gold, a conductive adhesive solder, or the like. For example, the height of the bump 4 is 10 μm to 50 μm. Each of the plurality of bumps 4 electrically connects the conductive pads 2A and the wiring patterns 3A at corresponding positions.

The sealing portion 5 hermetically seals the chip substrate 3 together with the wiring substrate 2 while leaving a space 6 between the wiring substrate 2 and the chip substrate 3. For example, the sealing portion 5 is formed of an insulator such as synthetic resin. The synthetic resin is an epoxy resin, polyimide, or the like.

Figure 2:
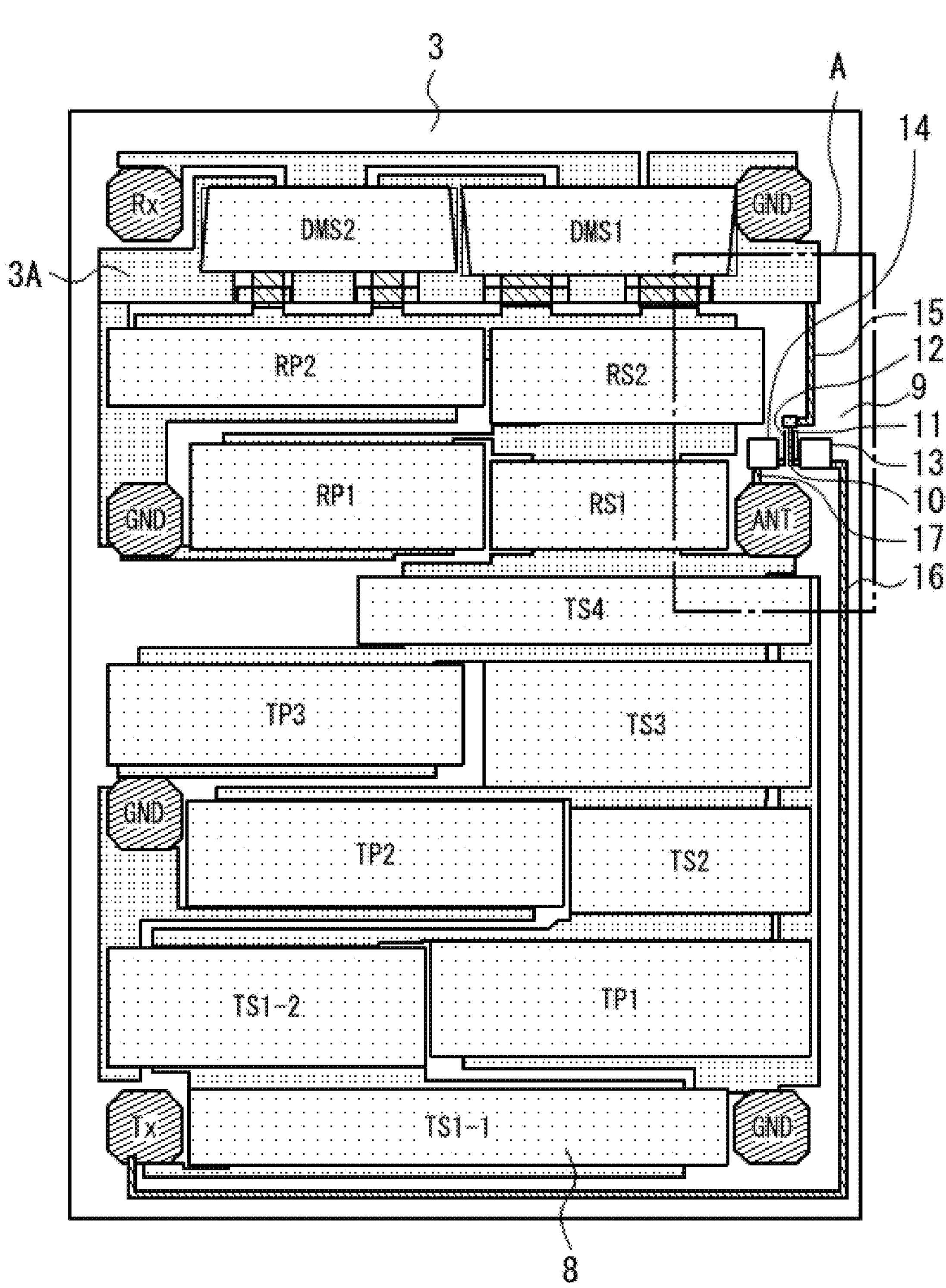
FIG. 2 is a view of a chip substrate viewed from below after a wiring substrate is removed in the acoustic wave device according to the first embodiment.
Figure 3:
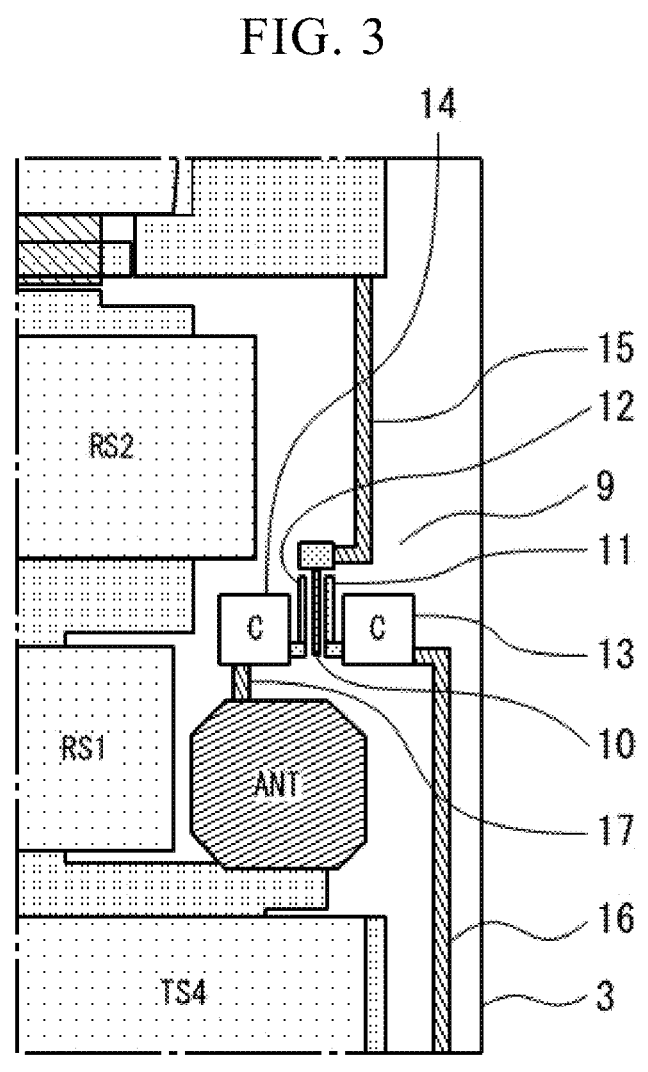
Figure 4:
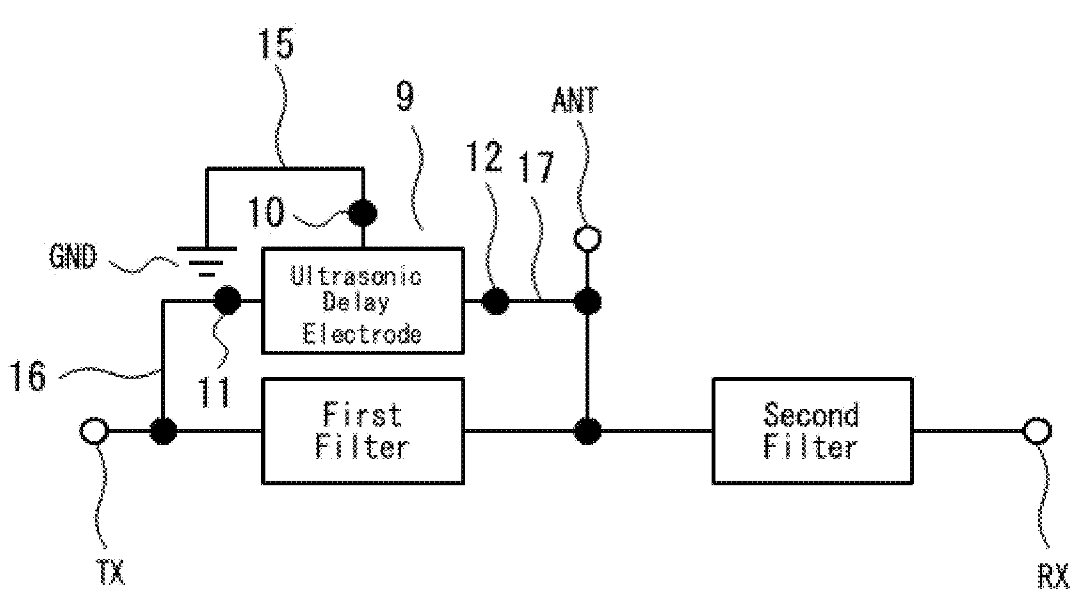
FIG. 4 is a schematic circuit diagram of the acoustic wave device according to the first embodiment.
Figure 5:
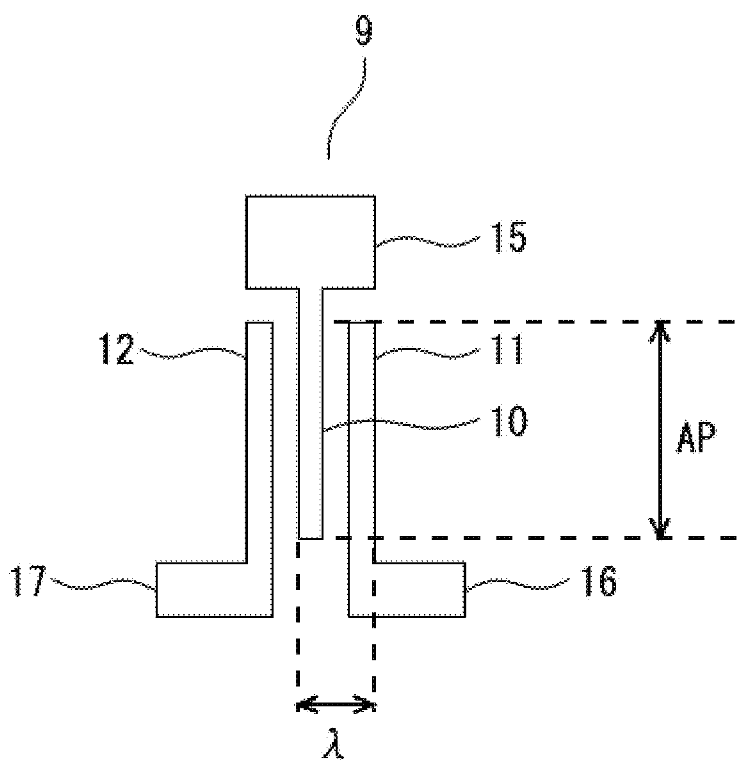
FIG. 5 is a schematic diagram of an ultrasonic delay structure of the acoustic wave device according to the first embodiment.

Next, the configuration of the chip substrate 3 will be described with reference to FIGS. 2 to 4. FIG. 2 is a view of the chip substrate viewed from below after the wiring substrate is removed in the acoustic wave device according to the first embodiment. FIG. 3 is an enlarged view of part A of FIG. 2. FIG. 4 is a schematic circuit diagram of the acoustic wave device according to the first embodiment. FIG. 5 is schematic diagram of an ultrasonic delay structure of the acoustic wave device according to the first embodiment.

As shown in FIG. 2, the wiring patterns 3A and a plurality of acoustic wave elements 8 are formed on the main surface of the chip substrate 3.

For example, the wiring patterns 3A may be formed of a metal or an alloy of silver, aluminum, copper, titanium, palladium, or the like. For example, the wiring patterns 3A are formed by stacking a plurality of metallic layers. The thickness of the wiring patterns 3A is 150 nm to 400 nm.

The wiring patterns 3A include four ground bump pads GND, an antenna bump pad ANT, a transmitting bump pad Tx, and a reception bump pad Rx. The ground bump pads GND are formed as ground terminals to be grounded. The antenna bump pad ANT is formed as a common terminal connected to an output side of the transmitting filter and an input side of the reception filter. The transmitting bump pad Tx is formed as a first filter terminal connected to an input side of the transmitting filter. The reception bump pad Rx is formed as a second filter terminal connected to an output side of the reception filter. These bump pads are portions electrically connected to the bumps 4 (not shown in FIG. 2).

The plurality of acoustic wave elements 8 include a plurality of series resonators TS1-1, TS1-2, TS2, TS3, TS4 and a plurality of parallel resonators TP1, TP2, TP3. The plurality of series resonators TS1-1. TS1-2, TS2, TS3, TS4 and the plurality of parallel resonator TP1, TP2, TP3 are electrically connected to each other via the wiring patterns 3A.

The plurality of series resonators TS1-1, TS1-2, TS2, TS3, TS4 and the plurality of parallel resonators TP1, TP2, TP3 function as transmitting filters. Specifically, when a high-frequency electric signal is inputted to the transmitting bump pad Tx, the electric signal passes through the plurality of series resonators TS1-1, TS1-2, TS2, TS3, TS4 and the plurality of parallel resonators TP1, TP2, TP3. At this time, only the electric signals in the desired frequency band reaches the antenna bump pad ANT. This outputs only the electric signals in the desired frequency band from the antenna bump pad ANT.

The plurality of acoustic wave elements 8 includes a plurality of series resonators RS1, RS2, a plurality of parallel resonators RP1, RP2, a first multimode resonator DMS1 and a second multimode resonator DMS2. The plurality of series resonators RS1, RS2, the plurality of parallel resonators RP1, RP2, the first multimode resonator DMS1 and the second multimode resonator DMS2 are electrically connected to each other via the wiring patterns 3A.

The plurality of series resonators RS1, RS2, the plurality of parallel resonators RP1, RP2, the first multimode resonator DMS1 and the second multimode resonator DMS2 function as reception filters. Specifically, when a high-frequency electric signal is inputted to the antenna bump pad ANT, the electric signal passes through the plurality of series resonators RS1, RS2, the plurality of parallel resonator RP1, RP2. At this time, only the electric signals in the desired frequency band reaches the reception bump pad Rx. This outputs only the electric signals in the desired frequency band from the reception bump pad Rx.

As shown in FIGS. 2 to 4, an ultrasonic delay structure 9 is provided in the present disclosure. The ultrasonic delay structure 9 is made of metal. For example, the ultrasonic delay feature 9 is deposited and patterned in the same manner as the wiring patterns 3A. The ultrasonic delay structure 9 includes a ground electrode 10, an input side ultrasonic delay electrode 11, an output side ultrasonic delay electrode 12, an input side capacitor 13 (not shown in FIG. 4), and an output side capacitor 14 (not shown in FIG. 4).

The ground electrode 10 is connected to a ground metal body 15 when the ground bump pad GND or a wire connected to the ground bump pad GND is used as the ground metal body 15. In the input side ultrasonic delay electrode 11, its longitudinal direction is arranged parallel to the longitudinal direction of the ground electrode 10 on one side of the ground electrode 10. The input side ultrasonic delay electrode 11 is connected to a input side metal body 16 when the transmitting bump pad Tx or a wire connected to the transmitting bump pad Tx is used as the input side metal body 16. In the output side ultrasonic delay electrode 12, its longitudinal direction is arranged parallel to the longitudinal direction of the ground electrode 10 on the other side of the ground electrode 10. The output side ultrasonic delay electrode 12 is connected to a output side metal body 17 when the antenna bump pad ANT or a wire connected to the antenna bump pad ANT is used as the output side metal body 17.

The ground electrode 10, the input side ultrasonic delay electrode 11 and the output side ultrasonic delay electrode 12 are formed such that the longitudinal direction thereof is orthogonal to the propagation direction of a wave which is the main mode of the transmitting filter or the reception filter.

The input side capacitor 13 is formed between the input side metal body 16 and the input side ultrasonic delay electrode 11. The output side capacitor 14 is formed between the output side metal body 17 and the output side ultrasonic delay electrode 12. For example, the input side capacitor 13 and the output side capacitor 14 are compact inter-digital capacitors.

In FIG. 5, the ground electrode 10, the input side ultrasonic delay electrode 11 and the output side ultrasonic delay electrode 12 are formed so that the phase of the high-frequency signal passing through the output side metal body 17 is delayed by a preset angle with respect to the phase of the high-frequency signal passing through the input side metal body 16. For example, the ground electrode 10, the input side ultrasonic delay electrode 11, and the output side ultrasonic delay electrode 12 are formed such that the phase of the high-frequency signal passing through the output side metal body 17 is delayed by an angle of between 95 degrees and 265 degrees with respect to the phase of the high-frequency signal passing through the input side metal body 16. For example, the ground electrode 10, the input side ultrasonic delay electrode 11 and the output side ultrasonic delay electrode 12 are formed such that the phase of the high-frequency signal passing through the output side metal body 17 is delayed by an angle of an integral multiple of 360 degree and an angle of between 95 degrees and 265 degrees with respect to a phase of a high frequency signal passing through the input side metal body 16. In addition, the amount of delay in phase can be adjusted by using either or both of the input side capacitor 13 and the output side capacitor 14.

It is desirable that the ultrasonic delay structure 9 has the same level of insertion loss in a frequency band in which the characteristics of the ultrasonic delay structure are desired to ensure attenuation of filter characteristics. The same level insertion loss means that, for example, the insertion loss of the ultrasonic delay line is 45 dB to 55 dB in case the desired attenuation is 50 dB in the frequency band in which the attenuation is desired to be ensured. The degree of insertion loss can be designed by the aperture length AP of the ultrasonic delay structure 9. In addition, the wavelength of the frequency band in which attenuation of the filter characteristics is desired to be ensured and the wavelength λ of the ultrasonic delay structure 9 do not necessarily have to coincide with each other.

Figure 6:
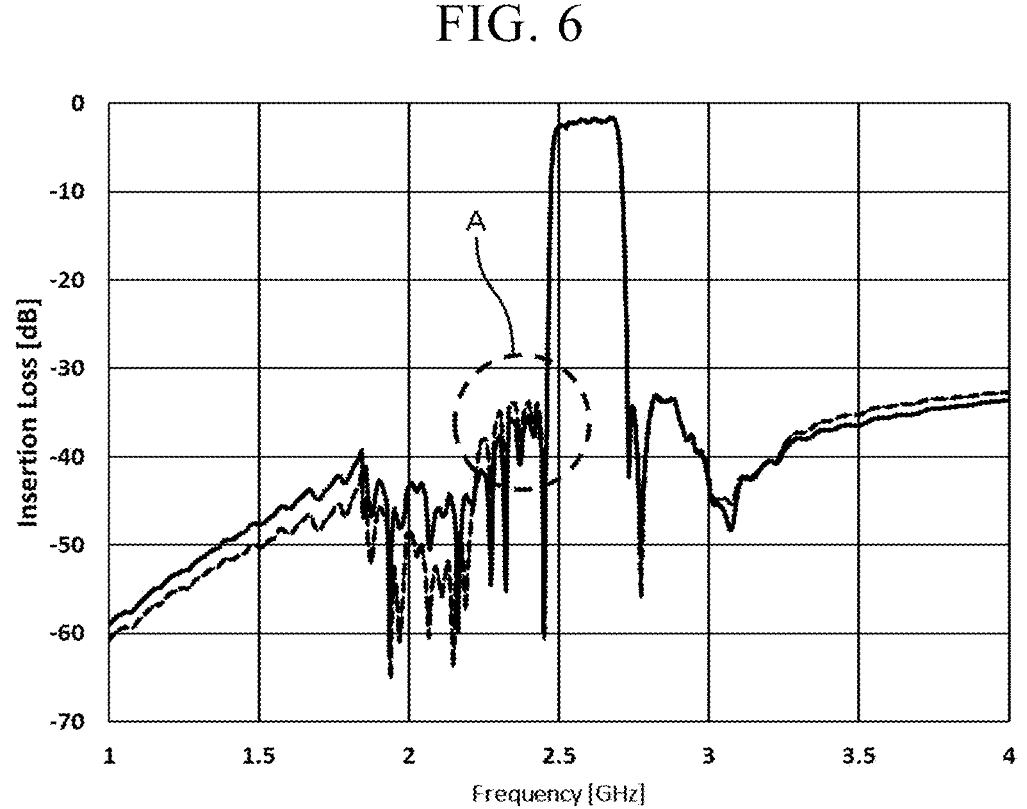
FIG. 6 is a diagram illustrating a pass characteristic of a filter included in the acoustic wave device according to the first embodiment and a filter included in an acoustic wave device of a comparative example.

FIG. 6 is a diagram illustrating a pass characteristic of a filter included in the acoustic wave device according to the first embodiment and a filter included in an acoustic wave device of a comparative example. The solid line indicates the passing characteristic of the filter included in the acoustic wave device according to the first embodiment. The dashed line indicates the passing characteristics of the filter included in the acoustic wave device of the comparative example.

As shown in the region A indicated by the dashed line in FIG. 6, it can be seen that the acoustic wave device according to the first embodiment has improved isolation characteristics of frequencies in the vicinity of the pass band on the low frequency side of the pass band of the filter. Thus, the present invention is particularly useful for improving the isolation characteristics in the vicinity of the passband of a predetermined filter. The present invention is also particularly useful in situations or environments where greater attenuation is required. In addition, the plurality of ultrasonic delay structures 9 may be used in order to ensure higher attenuation characteristics in the present invention.

The ultrasonic delay structure 9 used to obtain the pass characteristic shown in FIG. 6 has a pitch of 1 wavelength (λ shown in FIG. 5) of 1 μm and an aperture length AP of 80 λ. As described above, it is possible to obtain the desired isolation characteristics by forming a pitch of 1 wavelength so as to be 0.5 to 1 times the pitch of 1 wavelengths of the wave which is the main mode of the filter included in the acoustic wave device. Further, it is possible to secure the same level of insertion loss and obtain desired isolation characteristics in the frequency band to improve the isolation characteristics even though the aperture length AP is 80 λ and the electrodes are configured of three electrodes. In addition, when it is difficult to arrange the ultrasonic delay structure 9 with the aperture length of 80 λ, for example, two ultrasonic delay structures 9 may be arranged with the aperture length AP of 40 λ. The size of the aperture length AP is proportional to the insertion loss. The better the isolation characteristics can be obtained in the desired frequency band, the closer the level of insertion loss and the closer the phase shift is to 180 degrees.

Figure 7:
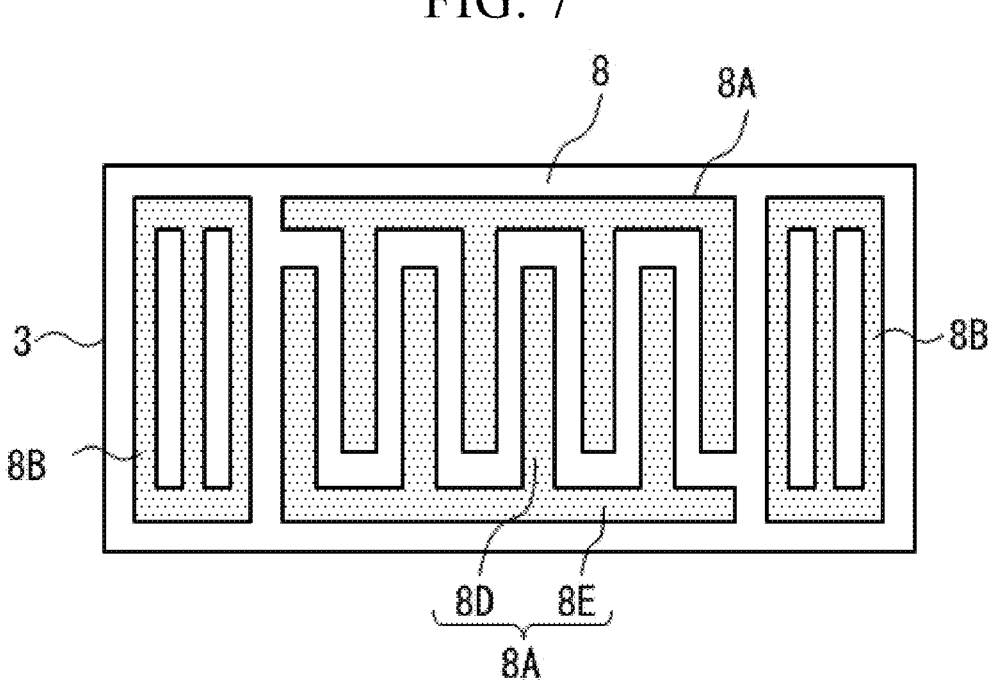
FIG. 7 is a diagram illustrating a first example of an acoustic wave elements of the acoustic wave device according to the first embodiment.

Next, a first example of the acoustic wave elements 8 will be described with reference to FIG. 7. FIG. 7 is a diagram illustrating the first example of an acoustic wave elements of the acoustic wave device according to the first embodiment.

In FIG. 7, the acoustic wave devices 8 are SAW (Surface Acoustic Wave) resonator. As shown in FIG. 7, the pair of IDT electrodes 8A and the pair of reflectors 8B are formed on the main surface of the chip substrate 3. The pair of IDT electrodes 8A and the pair of reflectors 8B are provided so as to excite a surface-acoustic wave.

For example, the pair of IDT electrodes 8A and the pair of reflectors 8B are made of an alloy of aluminum and copper. For example, the pair of IDT electrodes 8A and the pair of reflectors 8B may be made of a suitable metal such as titanium, palladium, silver or an alloy thereof. For example, the pair of IDT electrodes 8A and the pair of reflectors 8B are made of a stacked metal film in which a plurality of metal layers are stacked.

The IDT electrodes 8A include a plurality of electrode fingers 8D and a busbar 8E. The plurality of electrode fingers 8D are longitudinally aligned. The busbar 8E connects the plurality of fingers 8D so as to face each other. One of the pair of reflectors 8B adjoins one of the pair of IDT electrodes 8A. The other of the pair of reflectors 8B adjoins the other of the pair of IDT electrodes 8A. For example, the pair of IDT electrodes 8A and the pair of reflectors 8B are deposited and patterned in the same manner as the wiring pattern 3A (not shown in FIG. 7).

Figure 8:
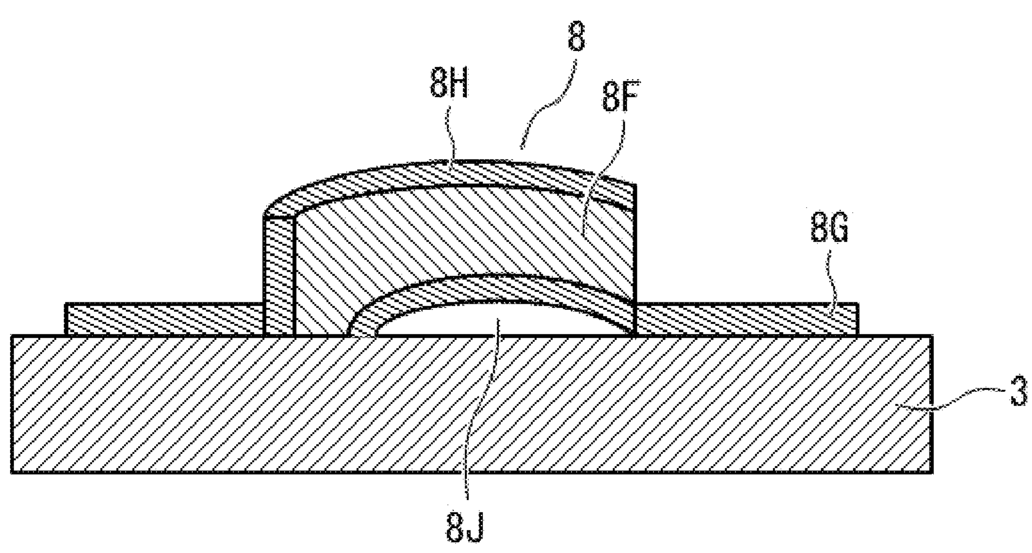
FIG. 8 is a diagram illustrating a second example of the acoustic wave element of the acoustic wave device according to the first embodiment.

Next, a second example of the acoustic wave elements 8 will be described with reference to FIG. 8. FIG. 8 is a diagram illustrating a second example of the acoustic wave element of the acoustic wave device according to the first embodiment.

In FIG. 8, the acoustic wave elements 8 are an acoustic thin film resonator. For example, the chip substrate 3 is a semiconductor substrate such as silicon, or an insulating substrate such as sapphire, alumina, spinel, or glass. A piezoelectric film 8F is provided on the main surface of the chip substrate 3. For example, the piezoelectric film 8F is formed of aluminum nitride. A lower electrode 8G and an upper electrode 8H are provided so as to sandwich the piezoelectric film 8F. For example, the lower electrode 8G and the upper electrode 8H are formed of a metal such as ruthenium. A gap 8J is formed between the lower electrode 8G and the chip substrate 3. In the acoustic thin film resonator, the lower electrode 8G and the upper electrode 8H excite an acoustic wave in a thickness longitudinal vibration-mode inside the piezoelectric film 8F.

According to the first embodiment described above, the acoustic wave device 1 includes the ultrasonic delay structure 9. Therefore, the isolation characteristics of the acoustic wave device 1 can be improved with a simpler configuration.

Further, the ground electrode 10, the input side ultrasonic delay electrode 11, and the output side ultrasonic delay electrode 12 are formed such that the longitudinal direction thereof is orthogonal to the propagation direction of a wave which is the main mode of the transmitting filter or the reception filter. Therefore, the time until the acoustic wave reaches the output side by exciting the same mode as the main mode is delayed. The delayed time allows the signal phase to be cancelled the noise signal substantially opposite in sign.

Further, the ground electrode 10, the input side ultrasonic delay electrode 11, and the output side ultrasonic delay electrode 12 are formed such that the phase of the high-frequency signal passing through the output side metal body 17 is delayed by an angle of an integral multiple of 360 degree and an angle of between 95 degrees and 265 degrees with respect to a phase of a high frequency signal passing through the input side metal body 16. Therefore, the phase synthesis of the signal passing through the ultrasonic delay line and the output signal allows the noise signal to be cancelled.

Figure 9:
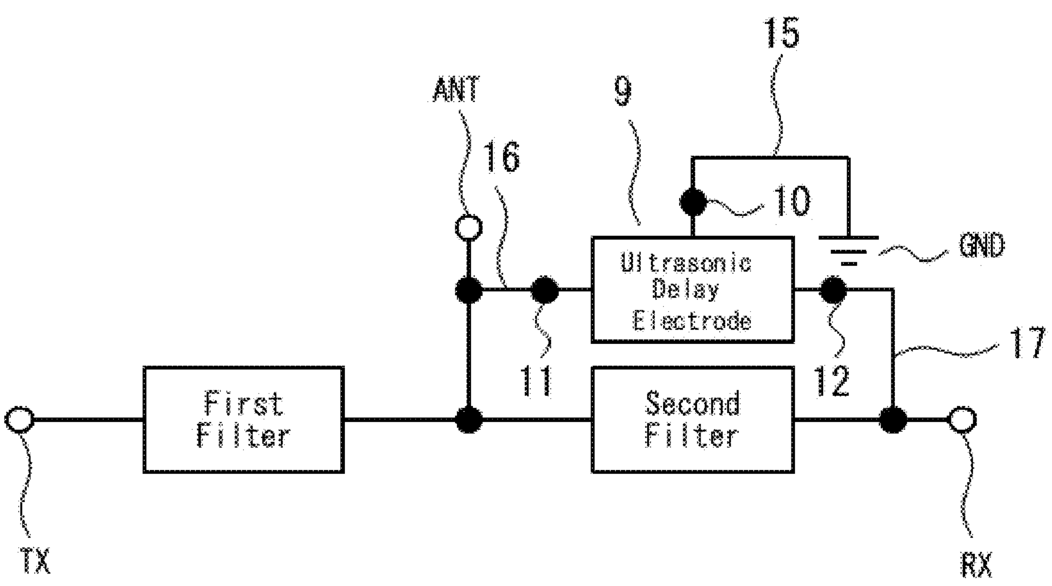
FIG. 9 is a schematic circuit diagram of a first modification of the acoustic wave device according to the first embodiment.
Figure 10:
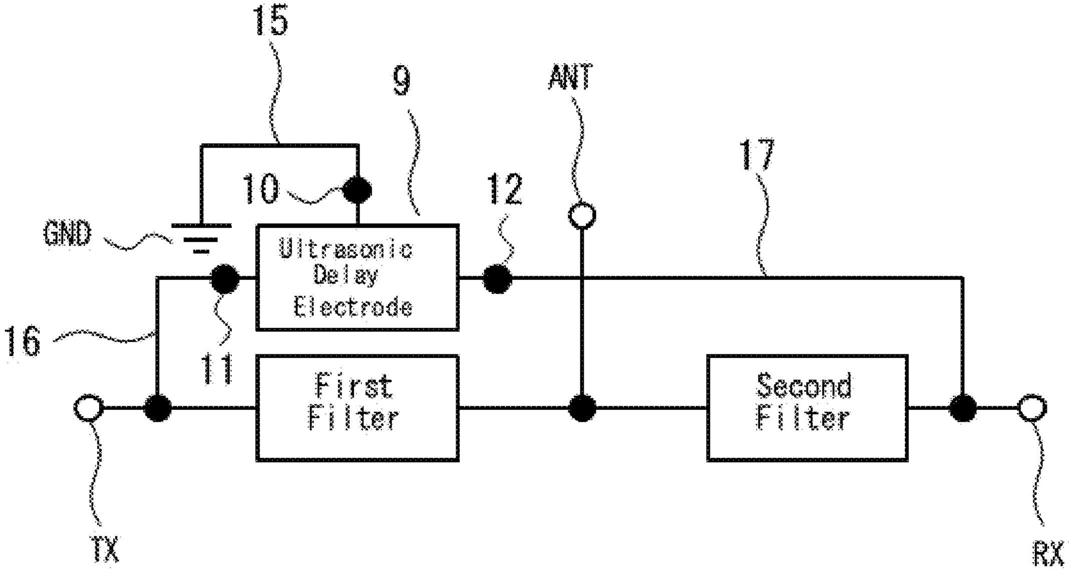
FIG. 10 is a schematic circuit diagram of a second modification of the acoustic wave device according to the first embodiment.

Next, modifications of the acoustic wave device 1 will be described with reference to FIG. 9 and FIG. 10. FIG. 9 is a schematic circuit diagram of a first modification of the acoustic wave device according to the first embodiment. FIG. 10 is a schematic circuit diagram of a second modification of the acoustic wave device according to the first embodiment.

As shown in FIG. 9, the antenna bump pad ANT or the wire connected to the antenna bump pad ANT may be used as the input side metal body 16 and the reception bump pad Rx and the wire connected to the reception bump pad may be used as the output side metal body 17.

As shown in FIG. 10, the transmitting bump pad Tx or the wire connected to the transmitting bump pad Tx may be used as the input side metal body 16 and the reception bump pad Rx and the wire connected to the reception bump pad may be used as the output side metal body 17.

In these modifications, the ultrasonic delay structure 9 may be designed as the same as the first embodiment. Specifically, in the desired frequency band, the insertion loss of the ultrasonic delay structure 9 and the insertion loss in the frequency band in which the attenuation is desired to be ensured are made closer to each other, and the phase shift is made closer to 180 degrees. In this case, the isolation characteristics can also be improved in these modifications.

Second Embodiment

Figure 11:
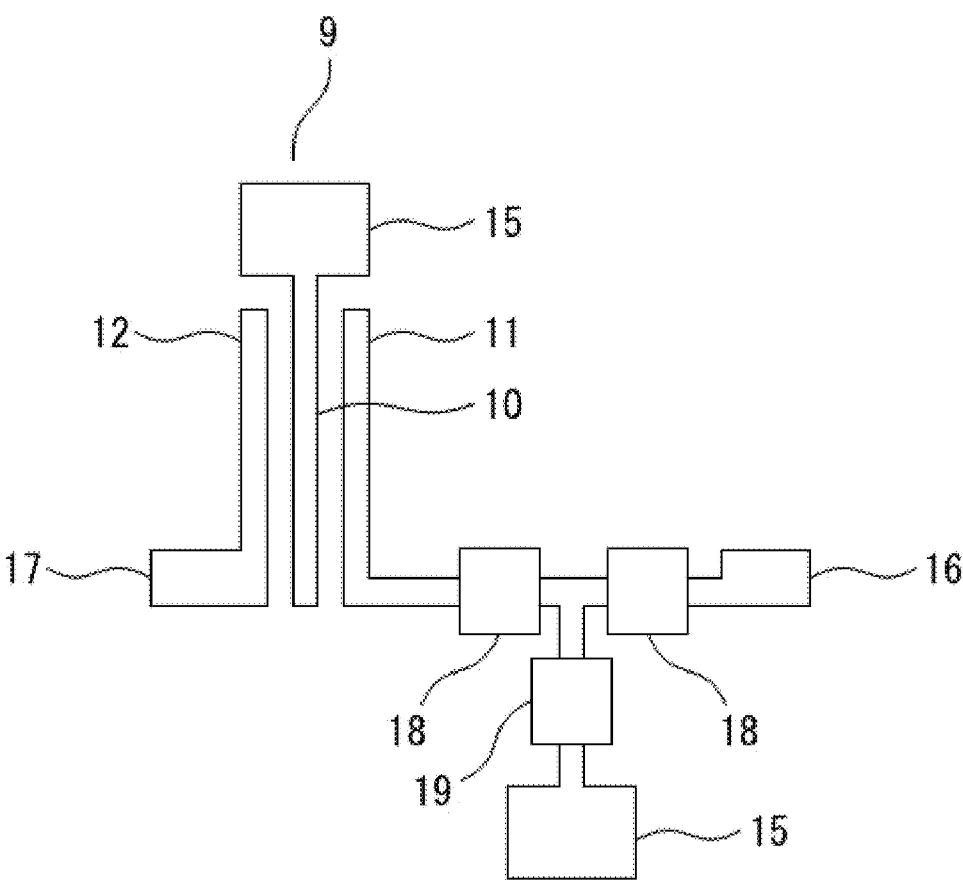
FIG. 11 is a schematic diagram of an ultrasonic delay structure of the acoustic wave device according to a second embodiment.

FIG. 11 is a schematic diagram of the ultrasonic delay structure 9 of the acoustic wave device according to a second embodiment. The same or corresponding parts with the first embodiment are denoted by the same reference numerals. Duplicate descriptions of such portions may be simplified or omitted.

As shown in FIG. 11, the ultrasonic delay structure 9 includes two series capacitors 18 and a parallel capacitor 19 in the second embodiment. The two series capacitors 18 are connected in series between the input side metal body 16 and the input side ultrasonic delay electrode 11. The parallel capacitor 19 is connected in parallel between two series capacitors 18. For example, the two series capacitors 18 and the parallel capacitor 19 are compact interdigital capacitors.

According to the second embodiment described above, the ultrasonic delay structure 9 includes the two series capacitors 18 and the parallel capacitor 19. Therefore, the power resistance of the acoustic wave device 1 can be more reliably improved.

Third Embodiment

Figure 12:
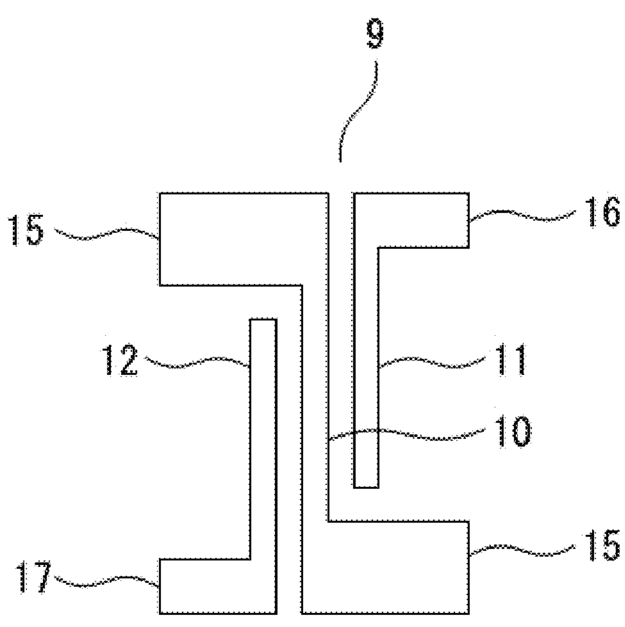
FIG. 12 is a schematic diagram of an ultrasonic delay structure of the acoustic wave device according to a third embodiment.

FIG. 12 is a schematic diagram of the ultrasonic delay structure 9 of the acoustic wave device according to a third embodiment. The same or corresponding parts with the first embodiment are denoted by the same reference numerals. Duplicate descriptions of such portions may be simplified or omitted.

As shown in FIG. 12, one end and the other end of the ground electrode 10 are respectively connected to the ground metal body 15 in the third embodiment.

According to the third embodiment described above, one end and the other end of the ground electrode 10 are respectively connected to the ground metal body 15. Therefore, the isolation characteristics of the acoustic wave device 1 can be more reliably improved.

Fourth Embodiment

Figure 13:
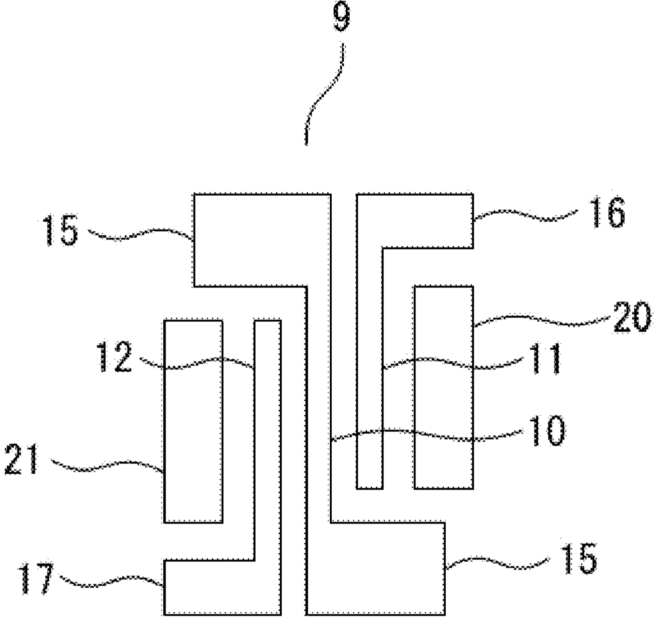
FIG. 13 is a schematic diagram of an ultrasonic delay structure of the acoustic wave device according to a fourth embodiment.

FIG. 13 is a schematic diagram of an ultrasonic delay structure 9 of the acoustic wave device according to a fourth embodiment. The same or corresponding parts with the first embodiment are denoted by the same reference numerals. Duplicate descriptions of such portions may be simplified or omitted.

As shown in FIG. 13, the ultrasonic delay structure 9 includes an input side surface wave absorber 20 and an output side surface wave absorber 21 in the fourth embodiment. The input side surface wave absorber 20 is formed so as to be adjacent to the opposite side of the ground electrode 10 of the input side ultrasonic delay electrode 11. The output side surface wave absorber 21 is formed so as to be adjacent to the opposite side of the ground electrode 10 of the output side ultrasonic delay electrode 12. For example, the input side surface wave absorber 20 and the output side surface wave absorber 21 are formed of polyimide.

According to the fourth embodiment described above, the ultrasonic delay structure 9 includes the input side surface wave absorber 20 and the output side surface wave absorber 21. Therefore, though an influence such as spurious is generated when the vibration excited by the ultrasonic delay structure 9 enters other resonators, the arrangement of the input side surface wave absorber 20 and the output side surface wave absorber 21 prevents the other resonators from being affected.

Fifth Embodiment

Figure 14:
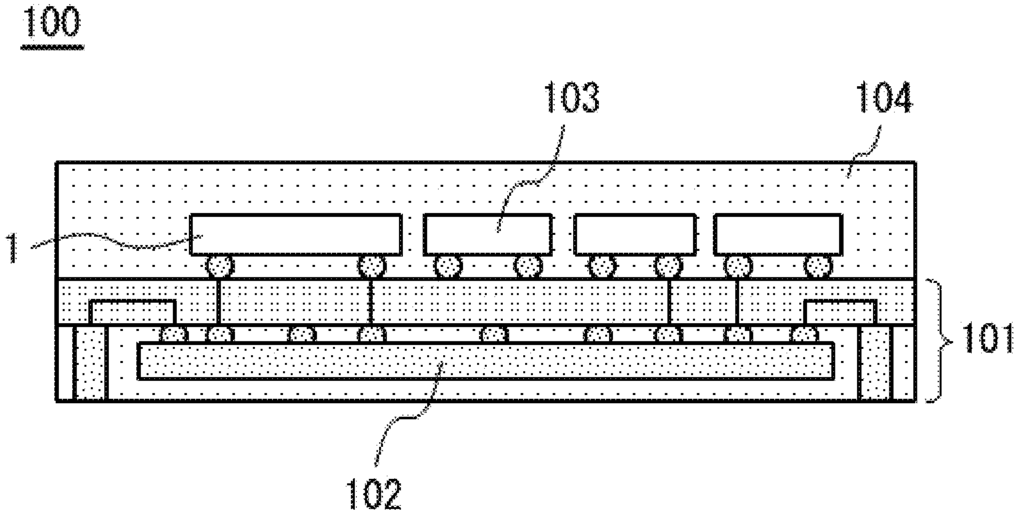
FIG. 14 a cross-sectional view of a module applies to the acoustic wave device according to a fifth embodiment.

FIG. 14 is a cross-sectional view of a module applies to the acoustic wave device according to a fifth embodiment. The same or corresponding parts with the first embodiment are denoted by the same reference numerals. Duplicate descriptions of such portions may be simplified or omitted.

In FIG. 14, a module 100 includes a wiring substrate 101, an integrated circuit component 102, the acoustic wave device 1, an inductor 103, and a sealing portion 104.

The wiring substrate 101 is equivalent to the wiring substrate 2 of the first embodiment. The integrated circuit component 102 is mounted inside the wiring substrate 101. The integrated circuit component 102 includes a switching circuit and a low noise amplifier. The acoustic wave device 1 is mounted on the main surface of the wiring substrate 101. The inductor 103 is mounted on the main surface of the wiring substrate 101. The inductor 103 is implemented for impedance matching. For example, the inductor 103 is an Integrated Passive Device (IPD). The sealing portion 104 seals a plurality of electronic components including the acoustic wave device 1

According to the fifth embodiment described above, the module 100 includes the acoustic wave device 1. Therefore, the module 100 including the acoustic wave device 1 having improved isolation characteristics can be obtained.

While several aspects of at least one embodiment have been described, it is to be understood that various modifications and improvements will readily occur to those skilled in the art. Such modifications and improvements are intended to be part of the present disclosure and are intended to be within the scope of the present disclosure.

It is to be understood that the embodiments of the methods and apparatus described herein are not limited in application to the structural and ordering details of the components set forth in the foregoing description or illustrated in the accompanying drawings. Methods and apparatus may be implemented in other embodiments or implemented in various manners. Specific implementations are given here for illustrative purposes only and are not intended to be limiting.

The phraseology and terminology used in the present disclosure are for the purpose of description and should not be regarded as limiting. The use of "including," "comprising," "having," and variations thereof herein means the inclusion of the items listed hereinafter and equivalents thereof, as well as additional items.

The reference to "or" may be construed so that any term described using "or" may be indicative of one, more than one, and all of the terms of that description.

References to front, back, left, right, top, bottom, and side are intended for convenience of description. Such references are not intended to limit the components of the present disclosure to any one positional or spatial orientation. Accordingly, the foregoing description and drawings are by way of example only.

What is claimed is:

1. An acoustic wave device comprising:

a first filter;

a second filter;

a ground terminal;

a common terminal connected to an output side of the first filter and an input side of the second filter;

a first filter terminal connected to an input side of the first filter;

a second filter terminal connected to an output side of the second filter;

a ground electrode connected to a ground metal body comprising the ground terminal or a wiring connected to the ground terminal;

an input side ultrasonic delay electrode connected to an input side metal body arranged in parallel with the ground electrode on one side of the ground electrode and includes the first filter terminal or a wiring connected to the first filter terminal; and an output side ultrasonic delay electrode connected to an output side metal body arranged in parallel with the ground electrode on another side of the ground electrode and includes the common terminal or a wiring connected to the common terminal, wherein the first filter comprises a transmitting filter comprising two series capacitors connected in series between the input side metal and the input side ultrasonic delay electrode and a parallel capacitor connected in parallel between two series capacitors.

2. An acoustic wave device comprising:

a first filter;

a second filter;

a ground terminal;

a common terminal connected to an output side of the first filter and an input side of the second filter;

a first filter terminal connected to an input side of the first filter;

a second filter terminal connected to an output side of the second filter;

a ground electrode connected to a ground metal body comprising the ground terminal or a wiring connected to the ground terminal;

an input side ultrasonic delay electrode connected to an input side metal body arranged in parallel with the ground electrode on one side of the ground electrode and includes the first filter terminal or a wiring connected to the first filter terminal; and an output side ultrasonic delay electrode connected to an output side metal body arranged in parallel with the ground electrode on another side of the ground electrode and includes the second filter terminal or a wiring connected to the second filter terminal, wherein the first filter comprises a transmitting filter comprising two series capacitors connected in series between the input side metal and the input side ultrasonic delay electrode and a parallel capacitor connected in parallel between two series capacitors.

3. The acoustic wave device according to claim 1, wherein the input side ultrasonic delay electrode and the output side ultrasonic delay electrode are formed so that longitudinal direction thereof is orthogonal to the propagation direction of a wave which is the main mode of the first filter or the second filter.

4. The acoustic wave device according to claim 1, wherein a pitch of wavelength from the input side ultrasonic delay electrode to the output side ultrasonic delay electrode is formed so as to be 0.5 to 1 times the pitch of 1 wavelengths of the wave in the main mode of the first filter or second filter.

5. The acoustic wave device according to claim 1, wherein the ground electrode, the input side ultrasonic delay electrode and the output side ultrasonic delay electrode are formed as a unit of ultrasonic delay line comprising ultrasonic delay function.

6. The acoustic wave device according to claim 1, wherein the ground electrode, the input side ultrasonic delay electrode and the output side ultrasonic delay electrode are formed so as that a phase of a high-frequency signal passing through the output side metal body is delayed by an angle of an integral multiple of 360 degree and an angle of between 95 degrees and 265 degrees with respect to a phase of a high frequency signal passing through the input side metal body.

7. The acoustic wave device according to claim 1, wherein one end and the other end of the ground electrode are respectively connected to the ground metal body.

8. The acoustic wave device according to claim 1, further comprising a surface wave absorber adjacent to the input side ultrasonic delay electrode or the output side ultrasonic delay electrode.

9. The acoustic wave device according to claim 2, wherein the input side ultrasonic delay electrode and the output side ultrasonic delay electrode are formed so that longitudinal direction thereof is orthogonal to the propagation direction of a wave which is the main mode of the first filter or the second filter.

10. The acoustic wave device according to claim 2, wherein a pitch of wavelength from the input side ultrasonic delay electrode to the output side ultrasonic delay electrode is formed so as to be 0.5 to 1 times the pitch of 1 wavelengths of the wave in the main mode of the first filter or second filter.

11. The acoustic wave device according to claim 2, wherein the ground electrode, the input side ultrasonic delay electrode and the output side ultrasonic delay electrode are formed as a unit ultrasonic delay line comprising ultrasonic delay function.

12. The acoustic wave device according to claim 2, wherein the ground electrode, the input side ultrasonic delay electrode and the output side ultrasonic delay electrode are formed so as that a phase of a high-frequency signal passing through the output side metal body is delayed by an angle of an integral multiple of 360 degree and an angle of between 95 degrees and 265 degrees with respect to a phase of a high frequency signal passing through the input side metal body.

13. The acoustic wave device according to claim 2, wherein one end and the other end of the ground electrode are respectively connected to the ground metal body.

14. The acoustic wave device according to claim 2, further comprising a surface wave absorber adjacent to the input side ultrasonic delay electrode or the output side ultrasonic delay electrode.

* * * * *